(12) United States Patent
Lai

(10) Patent No.: US 7,662,520 B2
(45) Date of Patent: Feb. 16, 2010

(54) HIGH-TRANSMITTANCE ATTENUATED PHASE-SHIFT MASK BLANK

(75) Inventor: Fu-Der Lai, Taipei (TW)

(73) Assignee: National Kaohsiung First University of Science and Technology, Taohsiung (TW)

( * ) Notice: Subject to any disclaimer, the term of this patent is extended or adjusted under 35 U.S.C. 154(b) by 598 days.

(21) Appl. No.: 11/244,227

(22) Filed: Oct. 6, 2005

(65) Prior Publication Data

US 2007/0082274 A1 Apr. 12, 2007

(51) Int. Cl.
G03F 1/00 (2006.01)

(52) U.S. Cl. .......................... 430/5; 428/428

(58) Field of Classification Search .................. 430/5, 430/311, 320–323; 428/408, 424–428, 433
See application file for complete search history.

(56) References Cited

U.S. PATENT DOCUMENTS

2003/0180630 A1* 9/2003 Shiota et al. ................. 430/5
2004/0023125 A1* 2/2004 Nozawa et al. ............... 430/5

* cited by examiner

Primary Examiner—Mark F Huff
Assistant Examiner—Stewart A Fraser
(74) Attorney, Agent, or Firm—Rosenberg, Klein & Lee

(57) ABSTRACT

The present invention discloses a HT-AttPSM (high-transmittance attenuated phase-shift mask) blank with phase-shifters composed of the $(Al_2O_3)_x/(TiO_2)_{1-x}$ superlattice film stacks, wherein x preferably ranges 79~84%. Particularly, the four-stacked superlattice films of the present invention perform superior optical properties including transmittance of 19.9% and a reflectance of 3.2% at the wavelength of 193 nm and an inspection transmittance less than 20% at the wavelength of 257 nm.

1 Claim, 4 Drawing Sheets

HIGH-TRANSMITTANCE ATTENUATED PHASE-SHIFT MASK BLANK

BACKGROUND OF THE INVENTION

1. Field of the Invention

The present invention relates to a HT-AttPSM (high-transmittance attenuated phase-shift mask) blank, which particularly performs proper transmittance and reflectance at an exposure 193 nm wavelength, and low inspection transmittance at the 257 nm wavelength.

2. Description of the Related Prior Arts

Currently, HT-AttPSM is developed as the focus margin increases with improvement of the photoresist technologies and the chrome assist feature. By employing the HT-AttPSM technique, the ArF lithography may have the potential to reach the 65 nm technology node.

The key optical requirements for an HT-AttPSM blank are: (1) a 180° phase shift, (2) a transmittance between 15~25%, preferably 18~20%, and (3) a reflectance less than 15% at an exposure wavelength of 193 nm; and (4) an inspection transmittance less than 40% at a wavelength of 257 nm.

Materials now used for AttPSM at wavelengths of 193 or 248 nm are hard to inspect at the 257 nm wavelength due to their high transmittance, and the reflectance of their coatings at the exposure wavelength is about 12~20%. However, a three-stacked $(Ta_2O_5)_x/(Al_2O_3)_{1-x}$ thin film exhibits a reflectance less than 7% as π-phase shifters at 248 nm wavelength, which indicates that composite multilayer films may be good candidate material.

$TiO_2$ and amorphous $Al_2O_3$ thin films have been widely used as material for many applications due to good properties such as chemical inertness, mechanical strength, hardness and satisfactory optical characteristics. $TiO_2$ films are generally used in applications such as corrosion protection, wear resistance, electronics and optics. Amorphous $Al_2O_3$ thin films are widely used in applications such as in optics, corrosion protection, wear resistance and electronics. However, their application as HT-AttPSM blanks in ArF lithography has not yet been reported.

Therefore, it's desired to develop a novel composite material for HT-AttPSM to solve the above problem.

SUMMARY OF THE INVENTION

The object of the present invention is to provide a HT-AttPSM (high-transmittance attenuated phase-shift mask) blank, which has a phase shifting layer complying conditions of: (1) reaching a phase-shift angle of 180 degree; (2) transmittance ranging 15%~25% and preferably 18%~20%; (3) reflectance less than 15% at the 193 nm wavelength; and (4) inspection transmittance less than 40% at the 257 nm wavelength.

To achieve the above object, the HT-AttPSM blank of the present invention comprises at least one stack of $Al_2O_3/TiO_2$ multilayer films as phase shifters, wherein x is a thickness fraction of the $Al_2O_3$ thin film in the $(Al_2O_3)_x/(TiO_2)_{1-x}$ multilayer film.

The stack number of the films preferably ranges 1~10, and more preferably is 4. The thickness fraction of $Al_2O_3$ preferably ranges 0.79~0.84.

DETAILED DESCRIPTION OF THE PREFERRED EMBODIMENTS

Equipment and Operation Parameters

Figure 1:
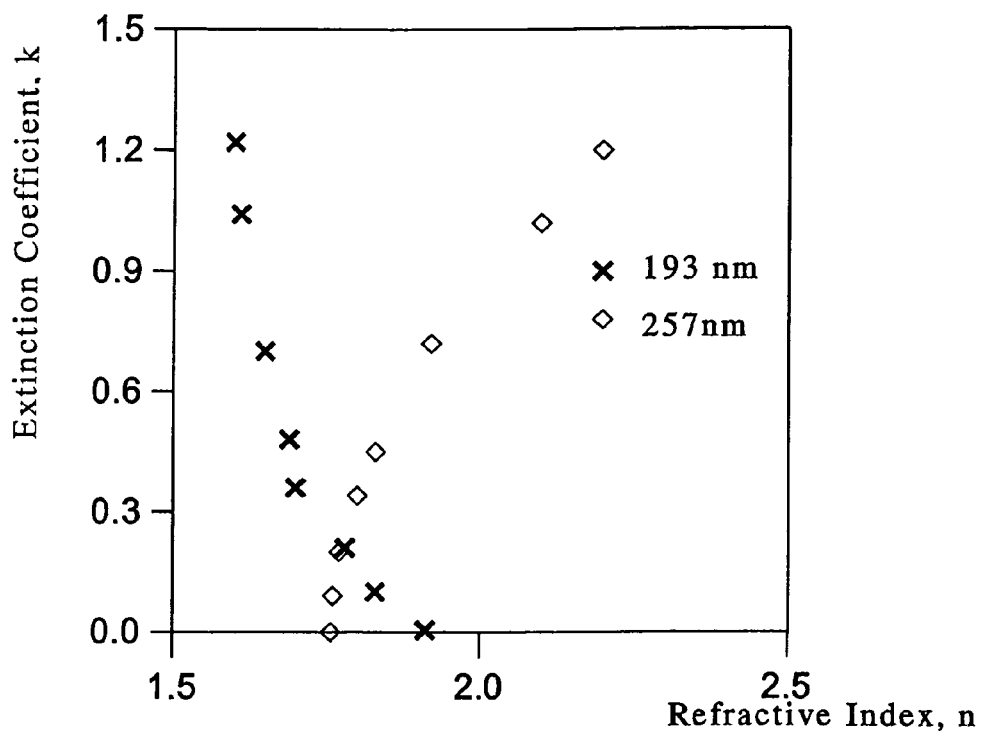
FIG. 1 shows the relationship of extinction coefficients (k) to refractive indexes (n) of the $(Al_2O_3)_x/(TiO_2)_{1-x}$ superlattice films at the wavelengths of 193 and 257 nm.

In Examples and Comparative Examples of the present invention, a dual-gun r.f. unbalanced magnetic sputtering system is used to deposit denser thin films other than a balanced system. Operation parameters for deposition are as follows: 8 mTorr pressure (in an atmosphere of Ar and $O_2$), room temperature, 10 sccm Ar flow rate, 20 sccm $O_2$ flow rate, 125 W sputtering power for Ti, and 85 W for Al targets. A deposition chamber surrounded by a heating girdle is evacuated to a base pressure of less than $1 \times 10^{-6}$ Torr using a cool trap and a diffusion pump. Gas inlet rings with 0.5 mm holes every cm are placed around the metal targets.

Thicknesses of the thin films are measured with an atomic force microscope (AFM). The reflectance and transmittance are measured by an optical spectrometer (Hitachi, U3501) and averaged over ten measurements.

Rotation of substrates is controlled with a computer.

Materials and Cleaning

The target materials are aluminum (99.999% purity) and titanium (99.99% purity). UV grade fused silica substrates having a surface flatness of λ/10 (λ=632.8 nm) are used in Examples and Comparative Examples. The substrates are cleaned in an ultrasonic bath by a series of processes: in trichlorethane for 5 min, in distilled ionized (D. I.) water for 10 min, in acetone for 5 min, in D. I. water for 10 min, in ethanol for 5 min, and in D. I. water for 10 min.

General Procedures for Deposition

Prior to deposition, the target is pre-sputtered for 20 min. at 12 mtorr Ar pressure to remove the $TiO_y$ (y<1.5) and $AlO_z$ (z<1.5) contaminants from the target erosion track, then for 1 hr under the deposition parameters of the film to poison the target surface and to fix the deposition rate as well as the properties of the film.

$Al_2O_3$ and $TiO_2$ are deposited on the substrate by sputtering. The deposited coatings can be expressed as $(Al_2O_3)_x/(TiO_2)_{1-x}$, in which an $Al_2O_3/TiO_2$ multilayer film stack is repeatedly deposited for SN (stack number) times, and x is a thickness fraction of the $Al_2O_3$ film in the multilayer film.

Table 1 lists the stack numbers (SN) and thickness fractions (x) of all Examples and Comparative Examples.

TABLE 1

| (Comparative) Example | SN | x |
|---|---|---|
| Example 1 | 1 | 0.8 |
| Example 2 | 2 | 0.8 |

TABLE 1-continued

| (Comparative) Example | SN | x |
|---|---|---|
| Example 3 | 3 | 0.8 |
| Example 4 | 4 | 0.8 |
| Example 5 | 6 | 0.8 |
| Example 6 | 8 | 0.8 |
| Example 7 | 10 | 0.8 |
| Comparative Example 1 | 1 | 0.8 |
| Comparative Example 2 | 2 | 0.8 |
| Comparative Example 3 | 0 | 0 |
| Comparative Example 4 | 4 | 0.2 |
| Comparative Example 5 | 4 | 0.4 |
| Comparative Example 6 | 4 | 0.6 |
| Comparative Example 7 | 4 | 0.7 |
| Comparative Example 8 | 4 | 0.9 |
| Comparative Example 9 | 0 | 1.0 |
| Comparative Example 10 | 4 | 0.82 |

To recognize the structure and properties of the films obtained in Examples and Comparative Examples, the following tests and measurements are performed.

Structure of $Al_2O_3$ and $TiO_2$ Thin Films

The structures of the deposited thin films are measured with x-ray diffraction. As a result, the structures of all the films obtained in Examples and Comparative Examples are amorphous.

Optical Properties of the $(Al_2O_3)_x/(TiO_2)_{1-x}$ Superlattice Films

A superlattice film is composed of at least one stack, and each stack consists of two or more thin films. The thickness of the superlatice film is less than 1/10 of the working wavelength. The optical properties of such a superlattice film are less sensitive to layer interface details, therefore, a ten-stacked film is a superlattice film with π-phase shifters.

The refractive indexes (n) and the extinction coefficients (k) of the film are determined according to the reflection-transmittance method in which the multiple reflection effects are taken into account.

Tables 2 and 3 respectively list extinction coefficients (k) and refractive indexes (n) of Examples 3 and Comparative Examples 3~9 at 193 nm and 257 nm.

TABLE 2

(193 nm)

| (Comparative) Example | n | k |
|---|---|---|
| Example 1 | 1.912 | 0.0045 |
| Comparative Example 3 | 1.83 | 0.1 |
| Comparative Example 4 | 1.78 | 0.21 |
| Comparative Example 5 | 1.7 | 0.36 |
| Comparative Example 6 | 1.69 | 0.48 |
| Comparative Example 7 | 1.65 | 0.7 |
| Comparative Example 8 | 1.61 | 1.04 |
| Comparative Example 9 | 1.6 | 1.22 |

TABLE 3

(257 nm)

| (Comparative) Example | n | k |
|---|---|---|
| Example 1 | 1.7569 | 0 |
| Comparative Example 3 | 1.76 | 0.09 |
| Comparative Example 4 | 1.77 | 0.2 |
| Comparative Example 5 | 1.8 | 0.34 |
| Comparative Example 6 | 0.48 | 1.83 |

TABLE 3-continued (257 nm)

| (Comparative) Example | n | k |
|---|---|---|
| Comparative Example 7 | 0.7 | 1.92 |
| Comparative Example 8 | 1.04 | 2.1 |
| Comparative Example 9 | 1.22 | 2.2 |

FIG. 1 shows the relationship of extinction coefficients (k) to refractive indexes (n) of the $(Al_2O_3)_x/(TiO_2)_{1-x}$ superlattice films at the wavelengths of 193 and 257 nm.

Figure 2:
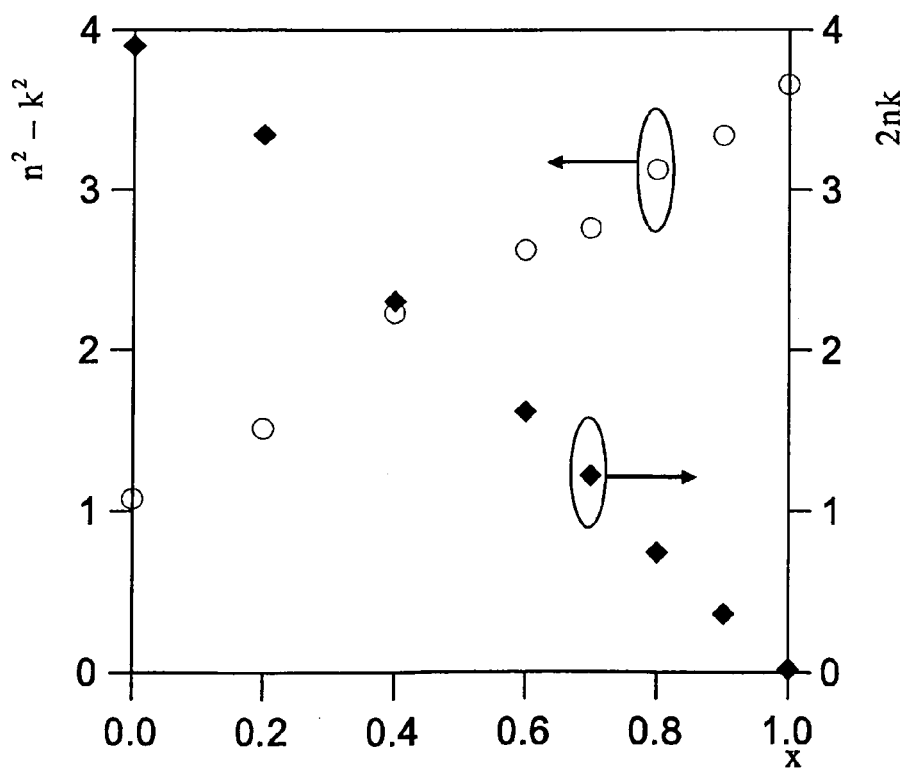
FIG. 2 shows the linear relationships of both $n^2-k^2$ and 2nk to the thickness fraction of $Al_2O_3$.

FIG. 2 shows the linear relationships of both $n^2-k^2$ and 2nk to the thickness fraction of all Example 1 and Comparative Examples 3~9. That is, the dielectric constants of $(Al_2O_3)_x/(TiO_2)_{1-x}$ superlattice films satisfy the equations (1) and (2) of the effective medium approximation.

$$e_{A(x)B(1-x)} = xe_A + (1-x)e_B, \quad (1)$$

$$e = (n-ik)^2 \quad (2)$$

wherein $e_{A(x)B(1-x)}$, $e_A$ and $e_B$ are respectively complex dielectric constants of an A/B multilayer film, an A film and a B film; and x is a thickness fraction of the A film in the A/B film stack.

The π-phase shift, which is the phase difference between the regions with and without deposited films, can be described as follows:

$$f = 2p(n_{A(x)B(1-x)} - 1)d/\lambda = p \quad (3)$$

wherein f is the phase shift; λ is the wavelength (193 nm); $n_{A(x)B(1-x)}$ is the effective refractive index of the film; and d is the total film thickness.

Accordingly, the optical properties of $(Al_2O_3)_x/(TiO_2)_{1-x}$ superlattice films can be tuned by changing the thickness fraction of $Al_2O_3$ in each stack of the film. The total film thickness with π-phase shift can be determined from the above equation (3) by substituting the refractive index and the thickness fractions of the $Al_2O_3$ and $TiO_2$.

Figure 3:
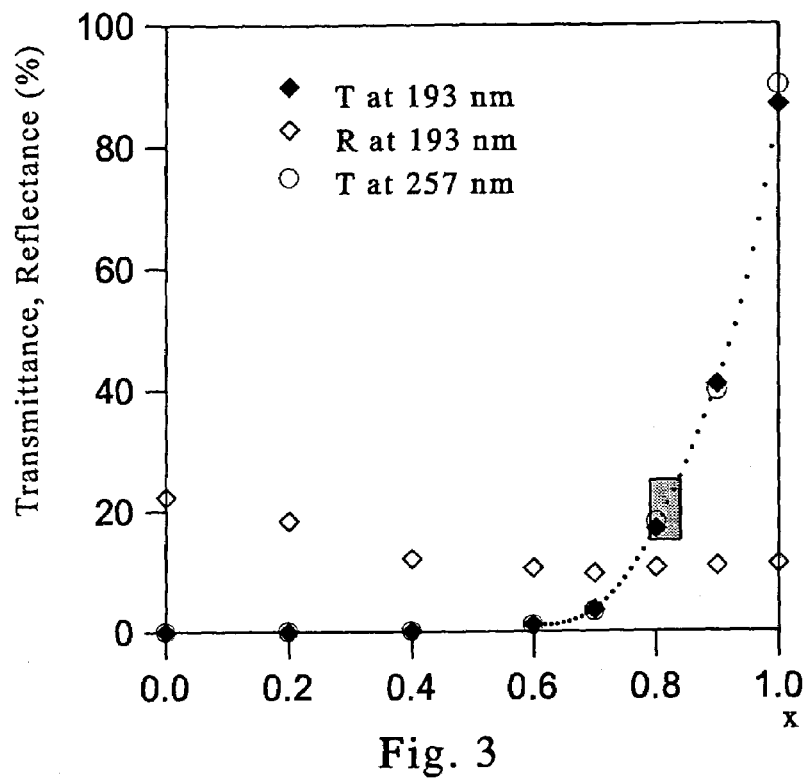
FIG. 3 illustrates transmittance and reflectance of the $(Al_2O_3)_x/(TiO_2)_{1-x}$ superlatice films with p-phase shift.

FIG. 3 illustrates transmittance and reflectance at the 193 nm wavelength and transmittance at the 257 nm wavelength for the $(Al_2O_3)_x/(TiO_2)_{1-x}$ superlatice films with p-phase shift, of Example 1 and Comparative Examples 3~9. A gray-colored area is marked according to optical requirements of the optimized HT-AttPSM blanks: (1) transmittance ranging 15%~25% at the 193 nm wavelength; (2) reflectance less than 15% at the 193 nm wavelength; and (3) inspection transmittance less than 40% at the 257 nm wavelength. Optical properties of Example 1 apparently falls in this area, as the thickness fraction of $Al_2O_3$ in the $Al_2O_3/TiO_2$ superlattice films is between about 79% and about 84%. The $(Al_2O_3)_x/(TiO_2)_{1-x}$ superlatice films with x=79%~84% perform a transmittance less than 25% at the 257 nm wavelength and therefore can serve as a good inspection layer. Meanwhile, the $(Al_2O_3)_x/(TiO_2)_{1-x}$ superlatice films with x=79%~84% satisfies optical requirements of the phase-shifter of the HT-AttPSM blank at a 193 nm wavelength, and therefore is considered a candidate material. In principle, when the reflectance at 193 nm wavelength is lower, the image is better.

Effects of Stack Number

Figure 4:
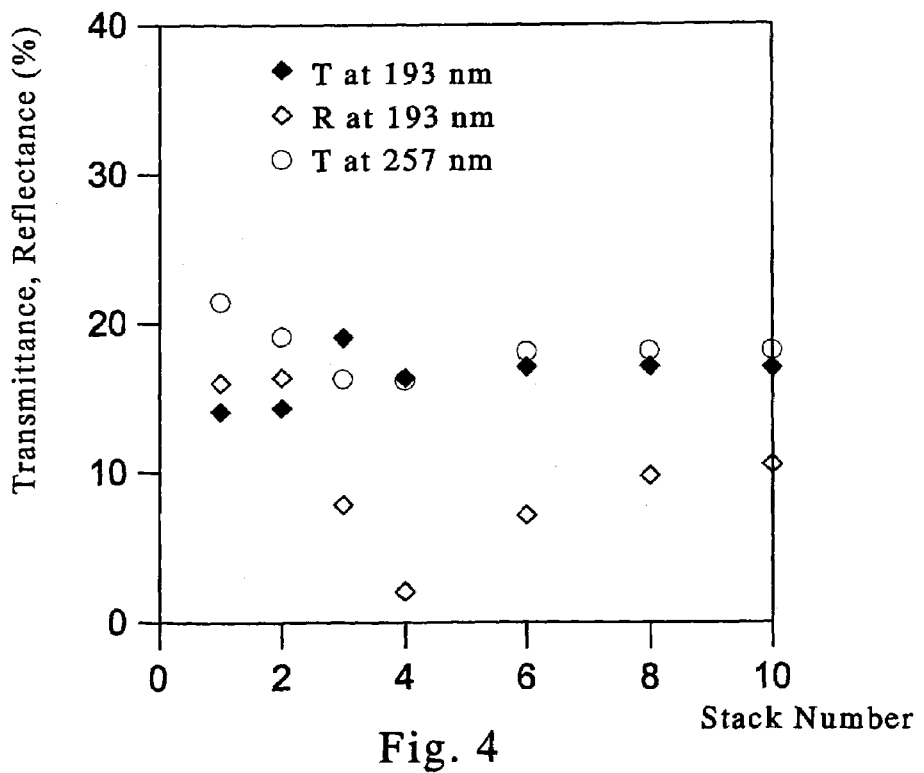
FIG. 4 shows relationship of the stack numbers (SN) to transmittance and reflectance at 193 nm wavelength and reflectance at 257 nm wavelength of the $(Al_2O_3)_x/(TiO_2)_{1-x}$ multilayer films with x=0.8.

FIG. 4 shows relationship of the stack numbers (SN) to transmittance and reflectance at 193 nm wavelength and reflectance at 257 nm wavelength of the $(Al_2O_3)_x/(TiO_2)_{1-x}$ multilayer films with x=0.8, of Examples 2~6 and Comparative Examples 1 and 2.

Figure 7:
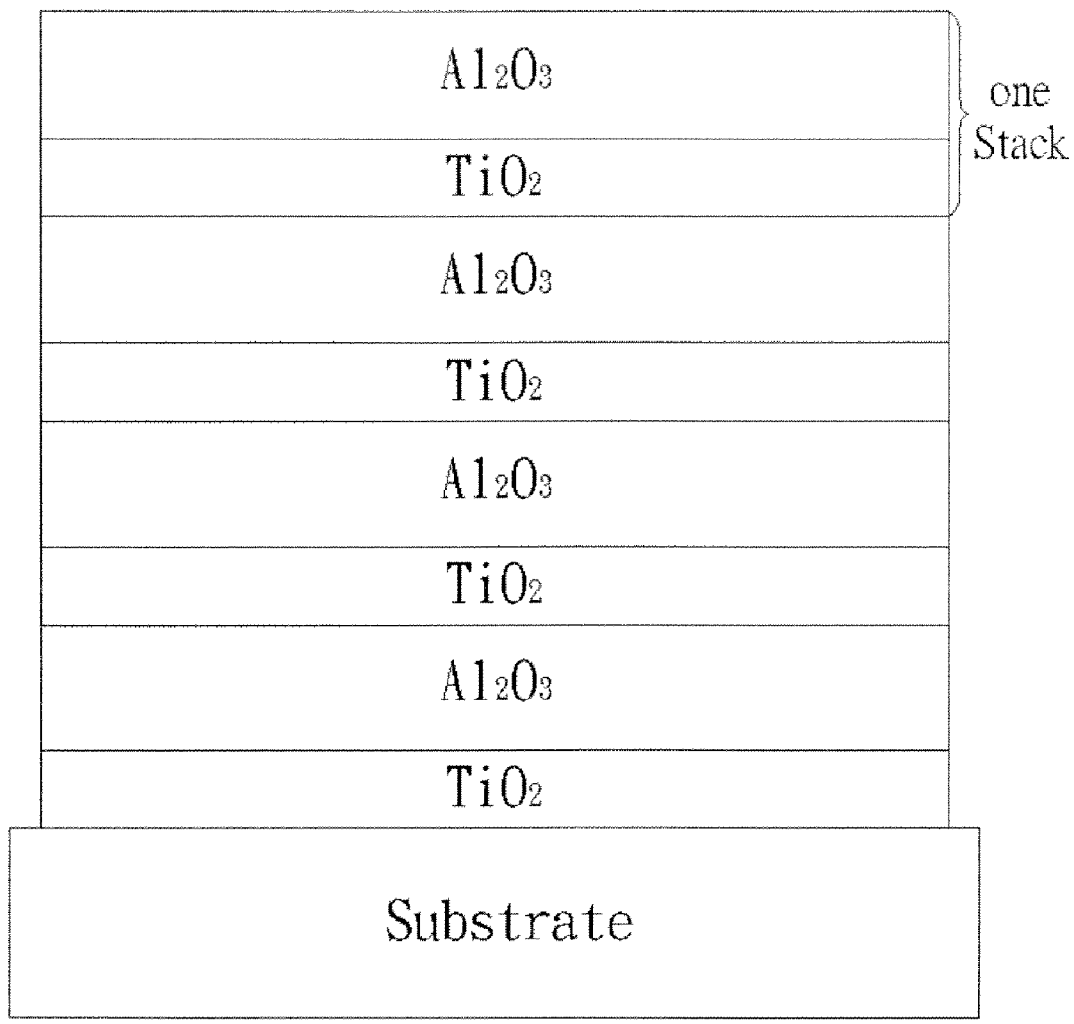
FIG. 7 shows the structure of phase-shift mask blank of the present invention.

For SN<4, reflectance decreases with increasing of SN. Particularly, for SN=1 or 2, reflectance is larger than 15% and thus not suitable for the HT-AttPSM blank. For SN=4, reflectance decreases from about 11% to about 3% with decreasing of SN. The structure of the phase-shift mask blank with four (SN=4) stacks is shown in FIG. 7, wherein each stack is composed of $Al_2O_3/TiO_2$ multilayer films. As a better pseudo image can be achieved with a lower reflectance at exposure wavelength, the four stacked $Al_2O_3/TiO_2$ films is the best option of the HT-AttPSM blank. As a result, the four stacked $(Al_2O_3)_x/(TiO_2)_{1-x}$ films with x =0.8 of Example 3 have a reflectance less than 4% and is the optimal material of HT-AttPSM blank at 193 mm wavelength.

Figure 5:
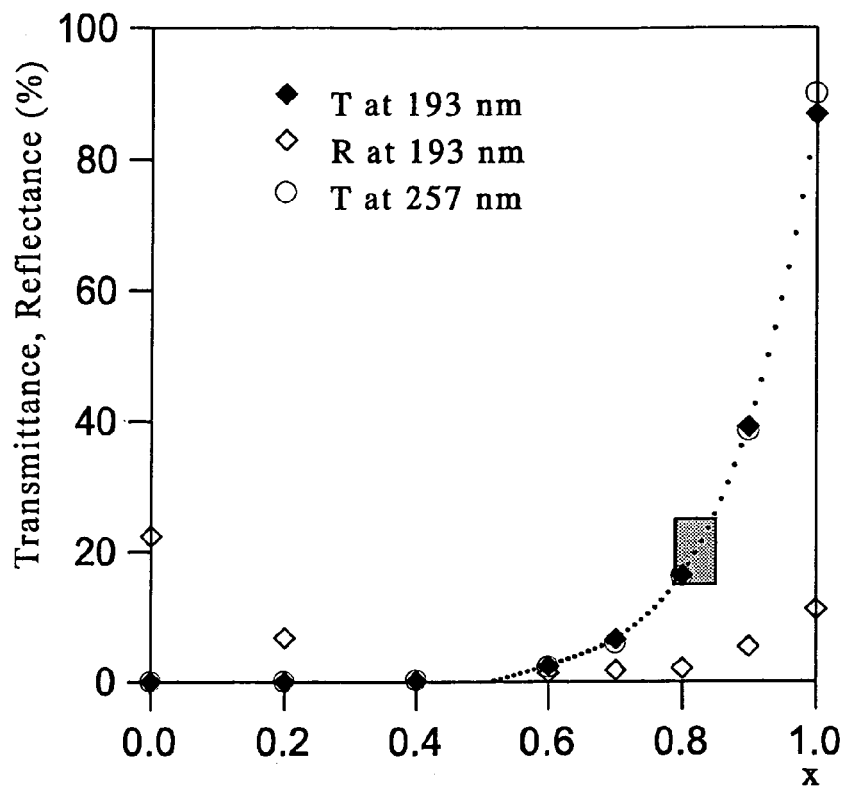
FIG. 5 shows the transmittance and reflectance of the four-stacked $(Al_2O_3)_x/(TiO_2)_{1-x}$ film.

FIG. 5 shows the transmittance and reflectance at 193 nm wavelength and transmittance at 257 nm wavelength of the four-stacked film obtained in Example 3 and Comparative Examples 10~16, in which a larger tunable range for optical properties is found. Compared with FIG. 3 (SN=8), differences between transmittances at 193 and 257 nm wavelength of the four-stacked $(Al_2O_3)_x/(TiO_2)_{1-x}$ films and those of the superlatice film are unobvious. For x=0.9, the four-stacked $(Al_2O_3)_x/(TiO_2)_{1-x}$ film has a transmittance less than 40% at 257 nm wavelength and can serve as a good inspection layer. However, for x≠0 or 1, the reflectance of the four-stacked $Al_2O_3/TiO_2$ film is less than that of the superlatice film. For $0.4 \leq x \leq 0.9$, reflectance is less than 4%, which indicates that the four-stacked film can be the optimal HT-AttPSM blank and produce better images. When the thickness fraction of $Al_2O_3$ in the four-stacked $(Al_2O_3)_x/(TiO_2)_{1-x}$ film ranges 79%~85%, the optimal optical properties at 193 nm wavelength thereof are achieved by Example 3. That is, the four-stacked $(Al_2O_3)_x/(TiO_2)_{1-x}$ film can be well applied to the HT-AttPSM blank at 193 nm wavelength due to features of: a wide range for tuning optical properties, a transmittance between 15 and 25%, a reflectance less than 4% at the exposure wavelength, and a transmittance less than 25% at the inspection wavelength.

Figure 6:
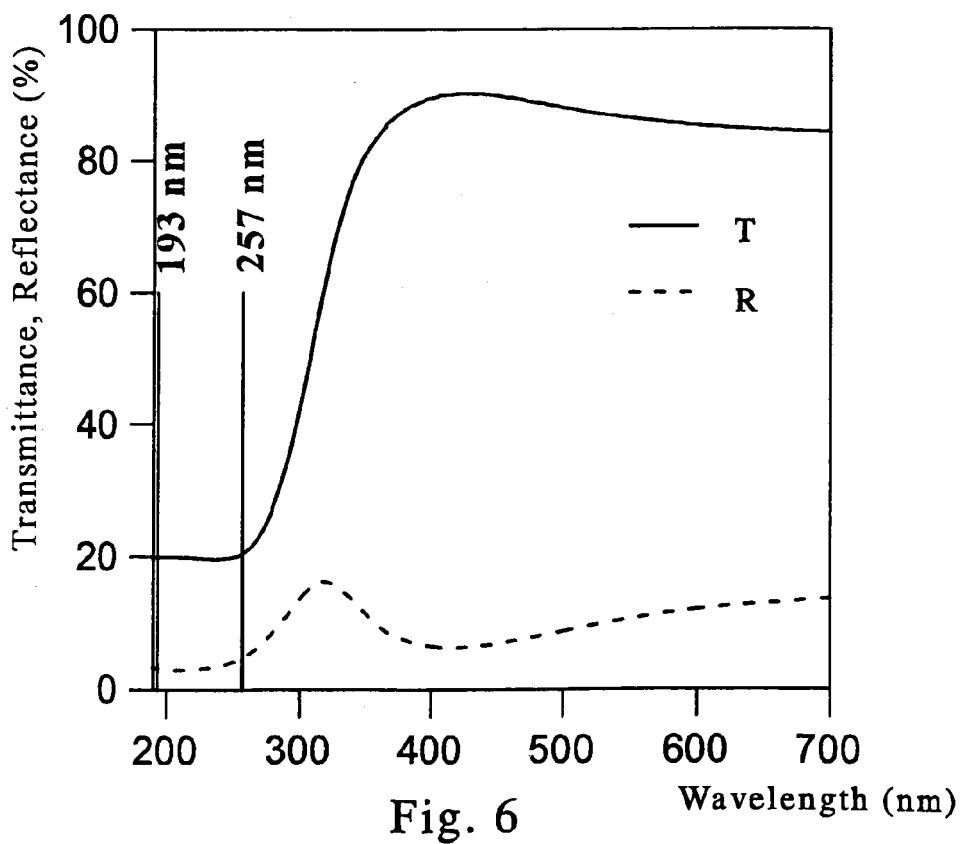
FIG. 6 shows the optical properties of the film produced in accordance with the present invention.

A desired HT-AttPSM blank generally complies with requirements of a transmittance up to 20%, a reflectance less than 15% at the exposure wavelength of 193 nm and a transmittance less than 40% at the inspection wavelength of 257 nm. For the four-stacked $Al_2O_3/TiO_2$ film of the present invention, the thickness is 120.8 nm, transmittance is 19.9%, reflectance is 3.2% far less than 15%, the phase shift at 193 nm wavelength is 180.7 degree, and the transmittance is far less than 19.9% at 257 nm wavelength, as shown in FIG. 6. That is, the film of the present invention is just the desired HT-AttPSM blank.

Chemical Durability Test

Chemical durability of the films is determined by measuring surface roughness of the four-stacked film before and after immersing the films in a solution of $H_2SO_4$ (90%, 10M) and $H_2O_2$ (10%) at 90° C. for one hour. The surface roughness is measured with an AFM (Digital Instruments, D3100) positioned on an isolation-free optical table (IDE, ETC-10LM2) and operated in the tapping mode.

Before tested, the film has a RMS (root mean square) surface roughness less than 0.2 nm and a difference from the maximum peak to valley magnitude less than 0.7 nm. After tested, the RMS value is less than 0.4 nm and the maximum value is less than 1.0 nm, as $Al_2O_3$ and $TiO_2$ films both exhibit good chemical inertness. Accordingly, the calculated average phase shift decreases by less than 3 degree, which is within the acceptable range for HT-AttPSM applications.

Adhesion Test

The adhesion between the composite films and the UV grade fused silica is analyzed according to the ASTM Crosshatch tape testing method. The test result indicates that the four-stacked film of the present invention exhibits good adhesion between the HT-AttPSM films and the fused silica substrate.

According to the present invention, $Al_2O_3$ and $TiO_2$ amorphous thin films and $(Al_2O_3)_x/(TiO_2)_{1-x}$ amorphous multilayer films have been successfully deposited on UV grade fused silica by r.f. reactive unbalanced magnetron sputtering in an atmosphere of argon and oxygen at room temperature. The optical properties of the $(Al_2O_3)_x/(TiO_2)_{1-x}$ superlattice films have been shown to satisfy the effective medium approximation and, therefore, can be tuned by the thickness fraction of $Al_2O_3$ in each stack of the film. $(Al_2O_3)_x/(TiO_2)_{1-x}$ superlattice films with x=79~84% as π-phase shifters have an appropriate transmittance of between 15 and 25% and a reflectance of less than 15% at a wavelength of 193 nm. They also have a transmittance of less than 25% at a wavelength of 257 nm and can thus be used as good inspection layers. Therefore, such $(Al_2O_3)_x/(TiO_2)_{1-x}$ superlattice films, with x=79~84%, form a new candidate for HT-AttPSM ArF lithographic work. Lower reflectance at the exposure wavelength of 193 nm is desirable for a better quality aerial image and lower transmittance at a wavelength of 257 nm is desirable for better inspection. To achieve better aerial images, a four-stack $(Al_2O_3)_x/(TiO_2)_{1-x}$ film used as a HT-AttPSM blank is a best selection because a four-stack film has lower reflectance than other films. Four-stack $(Al_2O_3)_x/(TiO_2)_{1-x}$ film, with x=79~85%, has a reflectance of less than 4% at the exposure wavelength of 193 nm as well as a transmittance of less than 25% at the inspection wavelength of 257 nm as π-phase shifters, therefore, the film is a very good candidate for ArF line HT-AttPSM blank material. The thickness fraction range of $Al_2O_3$ in the four-stack $(Al_2O_3)_x/(TiO_2)_{1-x}$ films is found to be between about 79% and about 85% for 193 nm wavelength HT-AttPSM blanks. To achieve an optimized HT-AttPSM blank film, having an optimized transmittance of 20% and a reflectance lower than 4% at the exposure wavelength of 193 nm and a transmittance lower than 20% at the inspection wavelength of 257 nm, one four-stack $Al2O_3/TiO_2$ film is fabricated with a thickness of 120.8 nm. This produces a reflectance of 3.2%, a transmittance of 19.9% and a calculated phase shift of ~180.7° at a wavelength of 193 nm, and a transmittance of 19.9% at a wavelength of 257 nm. It is expected that this type of four-stack $(Al_2O_3)_x/(TiO_2)_{1-x}$ film will have a lower reflectance at the exposure wavelength, thus producing better aerial images. It could also be used as an attenuated phase-shifting mask blank at the exposure wavelength as well as functioning as a good inspection layer at a wavelength of 257 nm. Such films could be used to produce the optimized HT-AttPSM blanks for the 65 nm-technology node, and could be used to design a desirable 193 nm wavelength HT-AttPSM. All of the $(Al_2O_3)_x/(TiO_2)_{1-x}$ coatings have passed the uniformity test and the adhesion test.

What is claimed is:

1. A HT-AttPSM (high-transmittance attenuated phase-shift mask) blank, comprising:
   a phase-shift layer composed of four stacks of $(Al_2O_3)_x/(TiO_2)_{1-x}$ multilayer films, wherein x is a thickness fraction of $Al_2O_3$ film in each of said $(Al_2O_3)_x/(TiO_2)_{1-x}$ multilayer films; said x=0.79~0.85.

* * * * *